(12) United States Patent
Cibere

(10) Patent No.: US 10,734,262 B2
(45) Date of Patent: Aug. 4, 2020

(54) SUBSTRATE SUPPORT IN A MILLISECOND ANNEAL SYSTEM

(71) Applicants: Mattson Technology, Inc., Fremont, CA (US); Beijing E-Town Semiconductor Technology Co., Ltd., Beijing (CN)

(72) Inventor: Joseph Cibere, Burnaby (CA)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 667 days.

(21) Appl. No.: 15/378,509

(22) Filed: Dec. 14, 2016

(65) Prior Publication Data

US 2017/0194178 A1 Jul. 6, 2017

Related U.S. Application Data

(60) Provisional application No. 62/272,841, filed on Dec. 30, 2015.

(51) Int. Cl.
*H01L 21/67* (2006.01)
*G01R 31/28* (2006.01)

(52) U.S. Cl.
CPC .... *H01L 21/67288* (2013.01); *G01R 31/2831* (2013.01); *H01L 21/6719* (2013.01); *H01L 21/67115* (2013.01); *H01L 21/67248* (2013.01)

(58) Field of Classification Search
CPC ......... H01L 21/67288; H01L 21/67115; H01L 21/67248; H01L 21/6719; H01L 21/68742;

(Continued)

(56) References Cited

U.S. PATENT DOCUMENTS

| 6,204,203 B1 | 3/2001 | Narwankar et al. |
| 7,393,207 B2 | 7/2008 | Imai |

(Continued)

FOREIGN PATENT DOCUMENTS

| JP | H08288372 | 11/1996 |
| JP | 2003-273191 | 9/2003 |

(Continued)

OTHER PUBLICATIONS

PCT International Search Report for corresponding PCT Application No. PCT/US2016/066563, dated Apr. 10, 2017, 3 pages.

(Continued)

*Primary Examiner* — Stephen W Smoot
*Assistant Examiner* — Vicki B. Booker
(74) *Attorney, Agent, or Firm* — Dority & Manning, P.A.

(57) ABSTRACT

Systems and methods for substrate support in a millisecond anneal system are provided. In one example implementation, a millisecond anneal system includes a processing chamber having a wafer support plate. A plurality of support pins can extend from the wafer support plate. The support pins can be configured to support a substrate. At least one of the support pins can have a spherical surface profile to accommodate a varying angle of a substrate surface normal at the point of contact with the substrate. Other example aspects of the present disclosure are directed to methods for estimating, for instance, local contact stress at the point of contact with the support pin.

15 Claims, 13 Drawing Sheets

(58) Field of Classification Search
CPC .............. H01L 21/683; H01L 21/67242; H01L 21/67098; H01L 21/324; H01L 22/00; H01L 21/677; H01L 21/68; H01L 23/544; H01L 21/302–322; G01R 31/2831; G01R 31/318511; G01R 31/26
See application file for complete search history.

(56) References Cited

U.S. PATENT DOCUMENTS

| | | | |
|---|---|---|---|
| 7,442,415 | B2 | 10/2008 | Conley, Jr. et al. |
| 7,790,633 | B1 | 9/2010 | Tarafdar et al. |
| 8,323,754 | B2 | 12/2012 | Olsen et al. |
| 8,809,175 | B2 | 8/2014 | Tsai et al. |
| 9,070,590 | B2 | 6/2015 | Camm et al. |
| 9,093,468 | B2 | 7/2015 | Tsai et al. |
| 2005/0133167 | A1 | 6/2005 | Camm et al. |
| 2007/0006806 | A1* | 1/2007 | Imai ............... H01L 21/324 118/620 |
| 2008/0157452 | A1 | 7/2008 | Camm et al. |
| 2008/0176415 | A1 | 7/2008 | Kim et al. |
| 2011/0177624 | A1 | 7/2011 | Camm et al. |
| 2012/0255365 | A1 | 10/2012 | Wimplinger |
| 2015/0140838 | A1 | 5/2015 | Kashefi et al. |

FOREIGN PATENT DOCUMENTS

| | | |
|---|---|---|
| JP | 2004-179566 | 6/2004 |
| JP | 2011-161521 | 8/2011 |

OTHER PUBLICATIONS

Ragnarsson et al., "The Importance of Moisture Control for EOT Scaling of Hf-Based Dielectrics," *Journal of the Electrochemical Society*, vol. 156, Issue 6, Apr. 3, 2009, pp. H416-H423.

Ferrari et al., "Diffusion Reaction of Oxygen in HfO2/SiO2/Si Stacks," *The Journal of Physical Chemistry B*, vol. 110, No. 30, Jul. 12, 2006, pp. 14905-14910.

Driemeier et al., "Thermochemical behavior of hydrogen in hafnium silicate films on Si," Applied Physics Letters, vol. 89, Issue 5, Aug. 2006,—4 pages.

Driemeier et al., "Room temperature interactions of water vapor with Hf O2 films on Si," Applied Physics Letters, vol. 88, Issue 20, May 2006—3 pages.

Conley, Jr. et al., "Densification and improved electrical properties of pulse-deposited films via in situ modulated temperature annealing," *Applied Physics Letters*, vol. 84, Issue 11, Mar. 15, 2004, pp. 1913-1915.

Nakajima et al., "Experimental Demonstration of Higher-k phase HfO2 through Non-equilibrium Thermal Treatment," ECS Transactions 28.2 (2010), pp. 203-212.

Wu et al., "Device Performance and Reliability Improvement for MOSFETs With HfO2 Gate Dielectrics Fabricated Using Multideposition Room-Temperature Multiannealing," IEEE Electron Device Letters, vol. 32, Issue 9, Sep. 2011, pp. 1173-1175.

PCT International Preliminary Report on Patentability for corresponding PCT Application No. PCT/US2016/066563, dated Jul. 12, 2018—12 pages.

* cited by examiner

SUBSTRATE SUPPORT IN A MILLISECOND ANNEAL SYSTEM

PRIORITY CLAIM

The present application claims the benefit of priority of U.S. Provisional Application Ser. No. 62/272,841, filed Dec. 30, 2015, entitled "Wafer Support in a Millisecond Anneal System," which is incorporated herein by reference.

FIELD

The present disclosure relates generally to thermal processing chambers and more particularly to millisecond anneal thermal processing chambers used for processing substrates, such as semiconductor substrates.

BACKGROUND

Millisecond anneal systems can be used for semiconductor processing for the ultra-fast heat treatment of substrates, such as silicon wafers. In semiconductor processing, fast heat treatment can be used as an anneal step to repair implant damage, improve the quality of deposited layers, improve the quality of layer interfaces, to activate dopants, and to achieve other purposes, while at the same time controlling the diffusion of dopant species.

Millisecond, or ultra-fast, temperature treatment of semiconductor substrates can be achieved using an intense and brief exposure of light to heat the entire top surface of the substrate at rates that can exceed $10^{4°}$ C. per second. The rapid heating of just one surface of the substrate can produce a large temperature gradient through the thickness of the substrate, while the bulk of the substrate maintains the temperature before the light exposure. The bulk of the substrate therefore acts as a heat sink resulting in fast cooling rates of the top surface.

SUMMARY

Aspects and advantages of embodiments of the present disclosure will be set forth in part in the following description, or may be learned from the description, or may be learned through practice of the embodiments.

One example aspect of the present disclosure is directed to a millisecond anneal system. The millisecond anneal system can include a processing chamber having a wafer support plate and a plurality of support pins extending from the wafer support plate. The plurality of support pins can be configured to support a semiconductor substrate. At least one of the support pins has a spherical surface profile to accommodate a varying angle of a substrate surface normal at the point of contact with the substrate.

Another example aspect of the present disclosure is directed to a method of determining local contact stress on a substrate resulting from a support structure in a millisecond anneal system. The method can include obtaining, by one or more processor circuits, a plurality of surface normal estimates for a substrate over a time period; generating, by the one or more processor circuits, a model specifying a bottom surface profile of the substrate over time based at least in part on the plurality of surface normal estimates; and determining, by the one or more processor circuits, data indicative of local contact stress at a point of contact between the substrate and a support structure based at least in part on the model.

Variations and modification can be made to the example aspects of the present disclosure. Other example aspects of the present disclosure are directed to systems, methods, devices, and processes for thermally treating a semiconductor substrate. Other example aspects are directed to processes for determining and analyzing substrate stress and motion.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
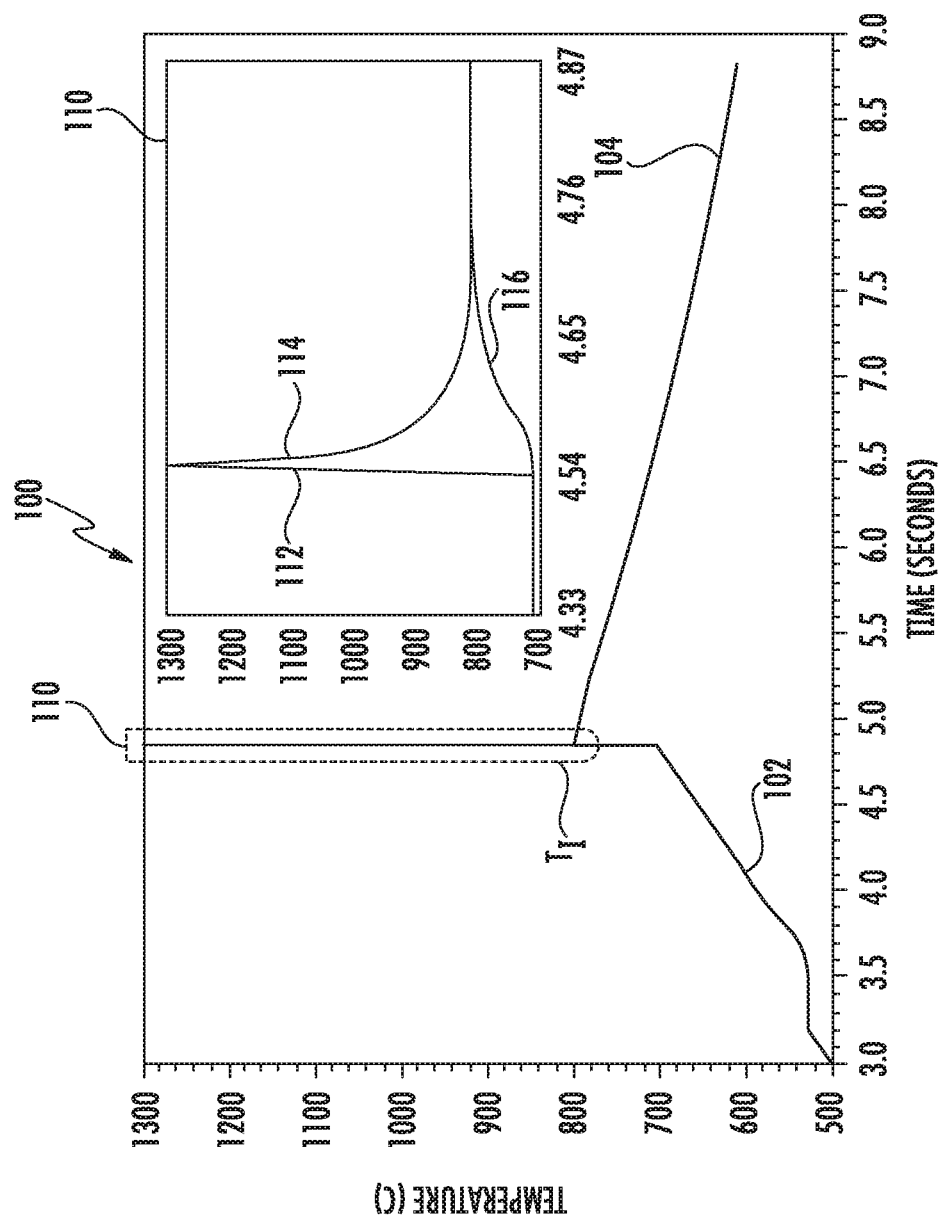
FIG. 1 depicts an example millisecond anneal heating profile according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to supporting a semiconductor substrate (e.g., a wafer) during millisecond annealing of the semiconductor substrate. Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any workpiece, semiconductor substrate or other suitable substrate. The use of the term "about" in conjunction with a numerical value refers to within 10% of the stated numerical value.

Millisecond, or ultra-fast, temperature anneal of semiconductor wafers can be achieved using an intense and brief exposure of light to heat the entire top surface of the wafer at rates that can exceed $10^{4°}$ C./sec. The rapid heating of the wafer surface produces a large temperature gradient through the thickness of the wafer that results in significant thermal stresses. These stresses begin to induce strain in the wafer that bows or deforms the wafer. This strain can continue to deform the wafer well after the application of surface heating. This continued strain can be due to the fact that the surface of the wafer is heated over a time interval that is typically much shorter than the time interval needed for the wafer to reach a thermal equilibrium where the thermal strain can be potentially relieved. Subsequently, the continued strain induces a stress that acts as an impulsive force that can cause the wafer to vibrate if there is no mechanism in place to confine or restrict the wafer motion. These wafer vibrations can increase the risk of the wafer fracture, or breakage, if the vibrating wafer surface contacts structures intended to support the wafer, such as the wafer support pins, with a velocity that is not zero. According to example aspects of the present disclosure, the shape, orientation, and/or freedom of movement of the surface of the support pin that comes in contact with the wafer can be configured so as to reduce the stress experienced by the wafer during contact with the support pin.

The requirements of support pin(s) can be significantly different than the requirements of support pin(s) in non-millisecond, or conventional, temperature annealing of wafers, also referred to as rapid thermal annealing or rapid thermal processing. In conventional rapid thermal processing, the bulk of the wafer, including the region where the support pin(s) contact the wafer, can reach temperatures of 1200° C. or greater and can remain at this temperature for a number of seconds or minutes. During this conventional annealing, the primary concern regarding the support pin(s) is to reduce heat loss over the wafer region where the support pin(s) are in contact with the wafer. This concern can be typically addressed by reducing the surface area of the support pin(s) that is in contact with the wafer under the constraint of preventing excessive contact pressure or stress caused by the fraction of the weight of the wafer carried by the support pin over the reduced contact area, from initiating damage to wafer or support pin.

In millisecond, or ultra-fast, temperature annealing of semiconductor wafers, at the region where the support pin(s) contacts the wafer, the temperature of the wafer only reaches into a range of approximately 800 to 950° C. At these temperatures, heat loss over the wafer region where the support pin(s) are in contact with the wafer, is less of a concern than the potential impact events caused by the transverse deformation and vibrational motion of the wafer contacting the support pin(s). The vibrational motion of the wafer is analogous to the vibration of the surface of taut skin of a drum struck by a drum stick.

According to example aspects of the present disclosure, the vibrational motion of the wafer can be quantified using finite element simulations and quantitative measurements using reflective, high-speed, photogrammetry of the wafer surface during the millisecond temperature annealing process. The vibrational motion of the wafer can exhibit transverse displacements on the order of several millimeters over a period of milliseconds. The transverse velocity of the surface of the wafer can therefore reach magnitudes on the order of meters per second. If a support structure, such as a pin(s), comes into contact with the wafer surface moving at these velocities, significant stress within, and around, the contact area on the wafer surface, can develop and potentially cause the wafer to fracture. Therefore, it is important to reduce the stress caused by the potential contact of the wafer surface with the support structures, such as the support pins.

According to example aspects of the present disclosure, the contact stress the wafer experiences when the surface of the wafer contacts the support pin can be reduced by increasing the radius of curvature of the support pin such that the extent of the curvature accommodates the varying angle of wafer surface normal at the point of contact, and/or by increasing the smoothness of the surface of the support pin over the region that comes into contact with the wafer surface, for example, by flame polishing the quartz support pins.

For instance, one example embodiment of the present disclosure is directed to a millisecond anneal system. The system includes a processing chamber having a wafer support plate. The system includes a plurality of support pins extending from the wafer support plate configured to support a substrate. At least one of the support pins has a spherical surface profile to accommodate a varying angle of a substrate surface normal at the point of contact with the substrate.

In some embodiments, the spherical surface profile has a span determined based at least in part on a maximum angle of the substrate surface normal at a point of contact with the substrate. For instance, the spherical surface profile has a span associated with at least two time the maximum angle. In some embodiments, the maximum angle is within the range of about 2° to about 8°.

In some embodiments, the plurality of support pins includes a first support pin located at a first radial distance relative to a center of a substrate and a second support pin located at a second radial distance relative to a center of the substrate. The second radial distance can be greater than the first radial distance. In some embodiments, the first support pin has a spherical surface profile with a first span and the second support pin has a spherical surface profile with a second span. The second span being greater than the first span.

In some embodiments, the support pin includes a quartz material. In some embodiments, the spherical surface profile is polished. In some embodiments, the support pin has a base structure supporting the spherical surface profile. The base structure can be a vertical base structure, an angled base structure, or a base structure with a T-shaped cross-section.

Another example aspect of the present disclosure is directed to a method of determining local contact stress on a substrate resulting from a support structure in a millisecond anneal system. The method includes: obtaining, by one or more processor circuits, a plurality of surface normal estimates for a substrate over a time period; generating, by the one or more processor circuits, a model specifying a bottom surface profile of the substrate over time based at least in part on the plurality of surface normal estimates; and determining, by the one or more processor circuits, data indicative of local contact stress at a point of contact between the substrate and a support structure (e.g., a support pin) based at least in part on the model. In some embodiments, the method can include modifying thermal processing based at least in part on the data indicative of local contact stress.

In some embodiments, determining, by the one or more processor circuits data indicative of local contract stress at a point of contact includes identifying, by the one or more processor circuits, an intersection of the bottom surface profile with the support structure using the model; and determining, by the one or more processor circuits, the point of contact with the support structure based on the intersection. In some embodiments, determining, by the one or more processor circuits data indicative of local contract stress at a point of contact includes determining a velocity of contact with the support structure. In some embodiments, data indicative of local contact stress at a point of contact comprises estimating the local contact stress based on the point of contact and the velocity of contact.

In some embodiments, the method can include estimating a stress distribution across the substrate based at least in part on the model. The stress distribution can be estimated based on a plurality of temperature measurements associated with the substrate.

Example Millisecond Anneal Systems

An example millisecond anneal system can be configured to provide an intense and brief exposure of light to heat the top surface of a wafer at rates that can exceed, for instance, about $10^{4°}$ C./s. FIG. 1 depicts an example temperature profile 100 of a semiconductor substrate achieved using a millisecond anneal system. As shown in FIG. 1, the bulk of the semiconductor substrate (e.g., a silicon wafer) is heated to an intermediate temperature $T_1$ during a ramp phase 102.

The intermediate temperature can be in the range of about 450° C. to about 900° C. When the intermediate temperature $T_1$ is reached, the top side of the semiconductor substrate can be exposed to a very short, intense flash of light resulting in heating rates of up to about $10^{4°}$ C./s. Window 110 illustrates the temperature profile of the semiconductor substrate during the short, intense flash of light. Curve 112 represents the rapid heating of the top surface of the semiconductor substrate during the flash exposure. Curve 116 depicts the temperature of the remainder or bulk of the semiconductor substrate during the flash exposure. Curve 114 represents the rapid cool down by conductive of cooling of the top surface of the semiconductor substrate by the bulk of the semiconductor substrate acting as a heat sink. The bulk of the semiconductor substrate acts as a heat sink generating high top side cooling rates for the substrate. Curve 104 represents the slow cool down of the bulk of the semiconductor substrate by thermal radiation and convection, with a process gas as a cooling agent. As used herein, the term "about" when used in reference to a numerical value refers to within 30% of the stated numerical value.

An example millisecond anneal system can include a plurality of arc lamps (e.g., four Argon arc lamps) as light sources for intense millisecond long exposure of the top surface of the semiconductor substrate—the so called "flash." The flash can be applied to the semiconductor substrate when the substrate has been heated to an intermediate temperature (e.g., about 450° C. to about 900° C.). A plurality of continuous mode arc lamps (e.g., two Argon arc lamps) can be used to heat the semiconductor substrate to the intermediate temperature. In some embodiments, the heating of the semiconductor substrate to the intermediate temperature is accomplished through the bottom surface of the semiconductor substrate at a ramp rate which heats the entire bulk of the wafer.

Figure 2:
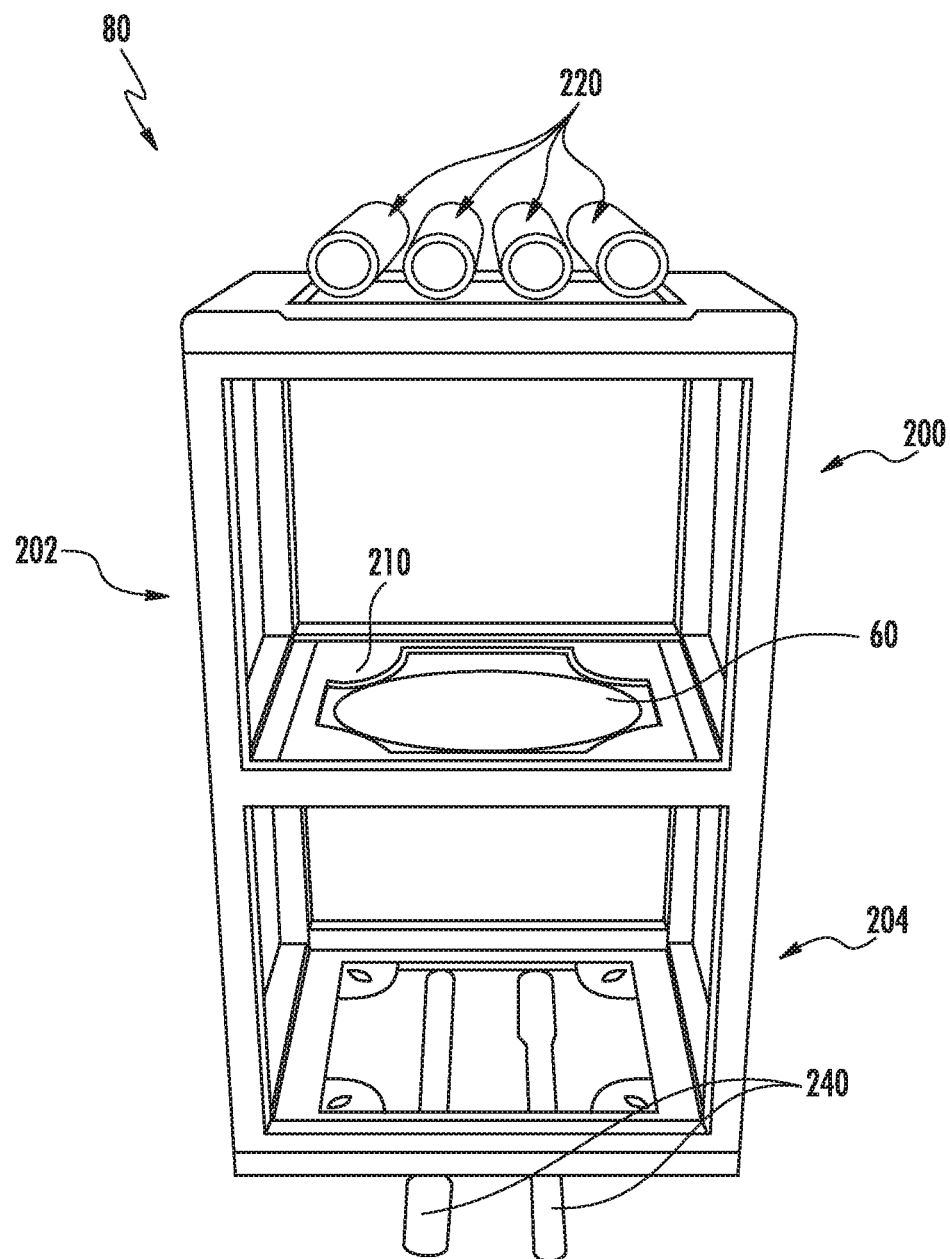
FIG. 2 depicts an example perspective view of a portion of an example millisecond anneal system according to example embodiments of the present disclosure.
Figure 3:
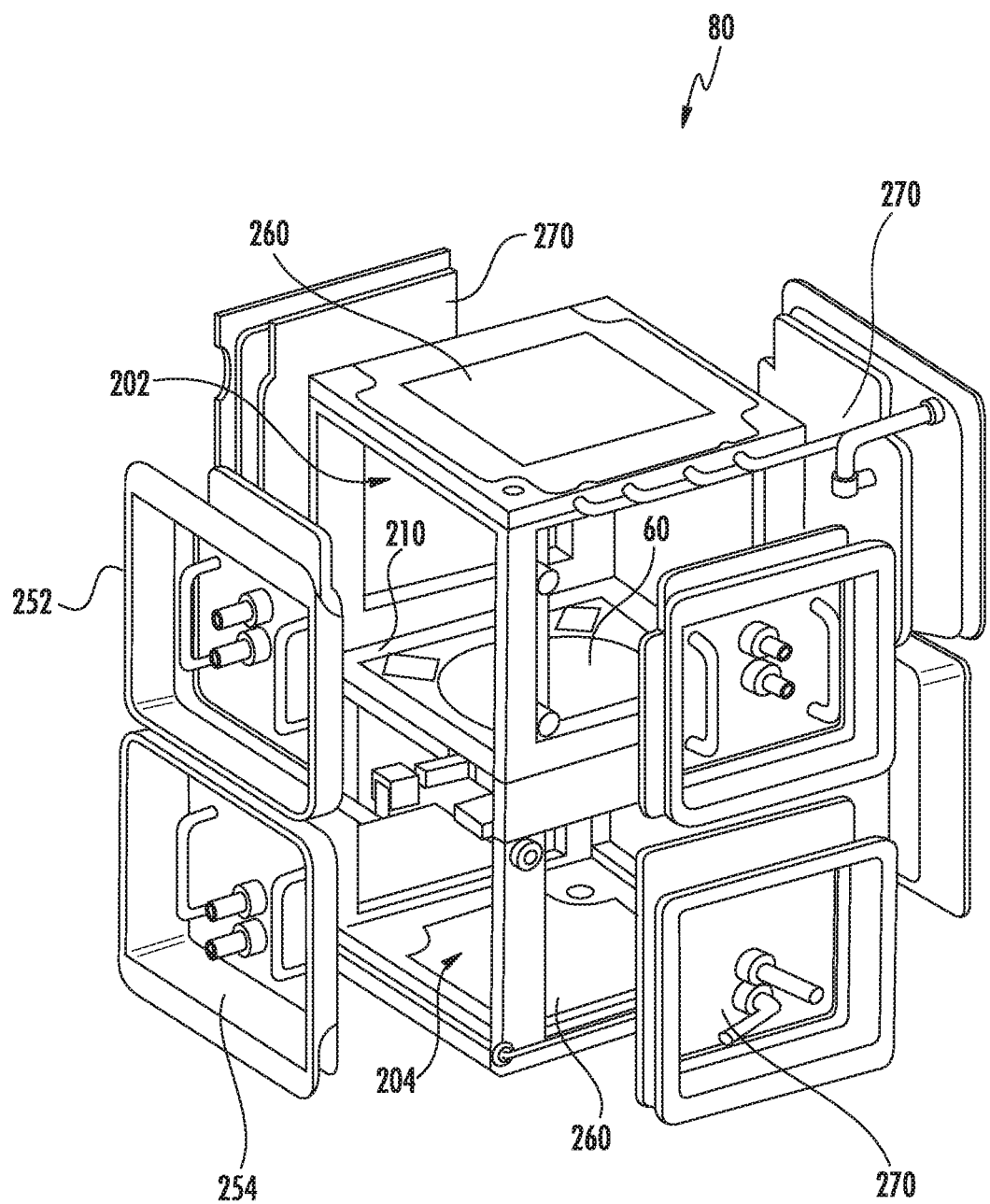
FIG. 3 depicts an exploded view of an example millisecond anneal system according to example embodiments of the present disclosure.
Figure 4:
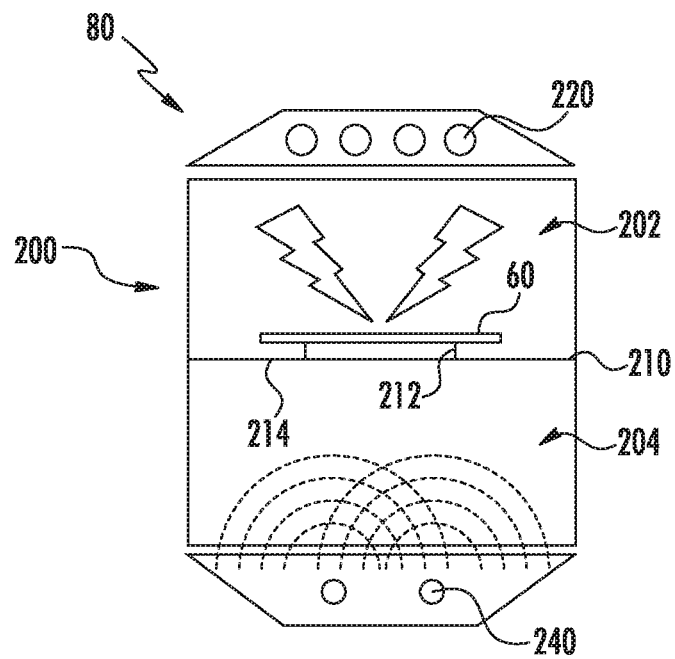
FIG. 4 depicts a cross-sectional view of an example millisecond anneal system according to example embodiments of the present disclosure.

FIGS. 2 to 5 depict various aspects of an example millisecond anneal system 80 according to example embodiments of the present disclosure. As shown in FIGS. 2-4, a millisecond anneal system 80 can include a process chamber 200. The process chamber 200 can be divided by a wafer plane plate 210 into a top chamber 202 and a bottom chamber 204. A semiconductor substrate 60 (e.g., a silicon wafer) can be supported by support pins 212 (e.g., quartz support pins) mounted to a wafer support plate 214 (e.g., quartz glass plate inserted into the wafer plane plate 210).

As shown in FIGS. 2 and 4, the millisecond anneal system 80 can include a plurality of arc lamps 220 (e.g., four Argon arc lamps) arranged proximate the top chamber 202 as light sources for intense millisecond long exposure of the top surface of the semiconductor substrate 60—the so called "flash." The flash can be applied to the semiconductor substrate when the substrate has been heated to an intermediate temperature (e.g., about 450° C. to about 900° C.).

A plurality of continuous mode arc lamps 240 (e.g., two Argon arc lamps) located proximate the bottom chamber 204 can be used to heat the semiconductor substrate 60 to the intermediate temperature. In some embodiments, the heating of the semiconductor substrate 60 to the intermediate temperature is accomplished from the bottom chamber 204 through the bottom surface of the semiconductor substrate at a ramp rate which heats the entire bulk of the semiconductor substrate 60.

As shown in FIG. 3, the light to heat the semiconductor substrate 60 from the bottom arc lamps 240 (e.g., for use in heating the semiconductor substrate to an intermediate temperature) and from the top arc lamps 220 (e.g., for use in providing millisecond heating by flash) can enter the processing chamber 200 through water windows 260 (e.g., water cooled quartz glass windows). In some embodiments, the water windows 260 can include a sandwich of two quartz glass panes between which an about a 4 mm thick layer of water is circulating to cool the quartz panes and to provide an optical filter for wavelengths, for instance, above about 1400 nm.

Figure 5:
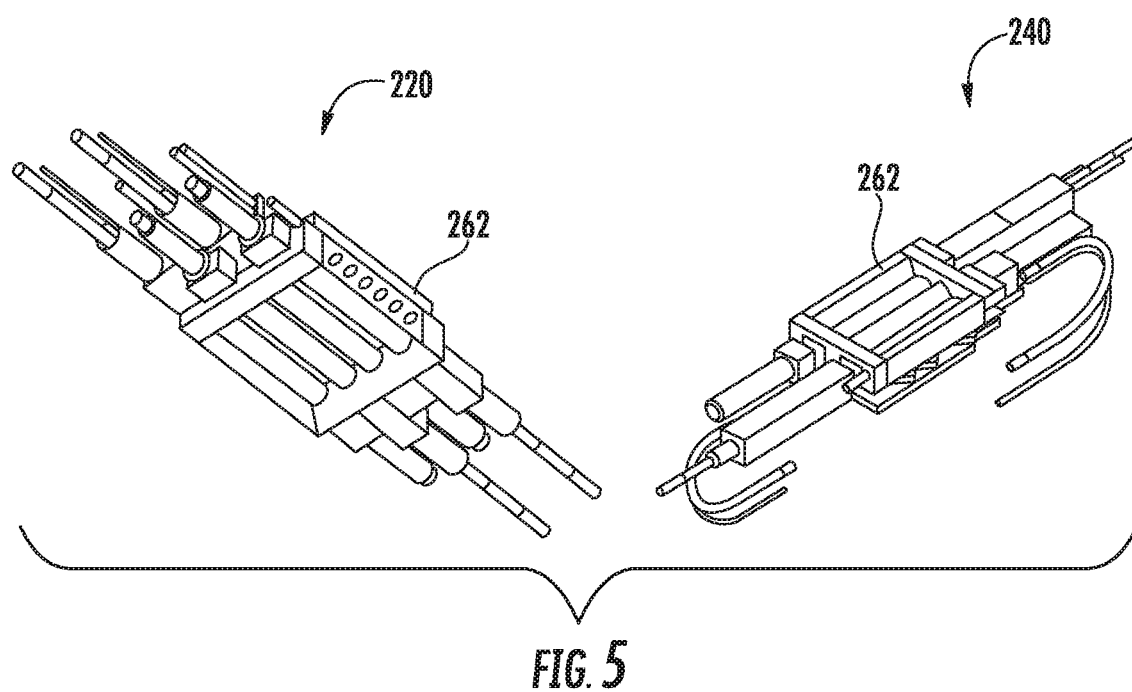
FIG. 5 depicts a perspective view of example lamps used in a millisecond anneal system according to example embodiments of the present disclosure.

As further illustrated in FIG. 3, process chamber walls 250 can include reflective mirrors 270 for reflecting the heating light. The reflective mirrors 270 can be, for instance, water cooled, polished aluminum panels. In some embodiments, the main body of the arc lamps used in the millisecond anneal system can include reflectors for lamp radiation. For instance, FIG. 5 depicts a perspective view of both a top lamp array 220 and a bottom lamp array 240 that can be used in the millisecond anneal system 200. As shown, the main body of each lamp array 220 and 240 can include a reflector 262 for reflecting the heating light. These reflectors 262 can form a part of the reflecting surfaces of the process chamber 200 of the millisecond anneal system 80.

The temperature uniformity of the semiconductor substrate can be controlled by manipulating the light density falling onto different regions of the semiconductor substrate. In some embodiments, uniformity tuning can be accomplished by altering the reflection grade of small size reflectors to the main reflectors and/or by use of edge reflectors mounted on the wafer support plane surrounding the wafer.

Figure 6:
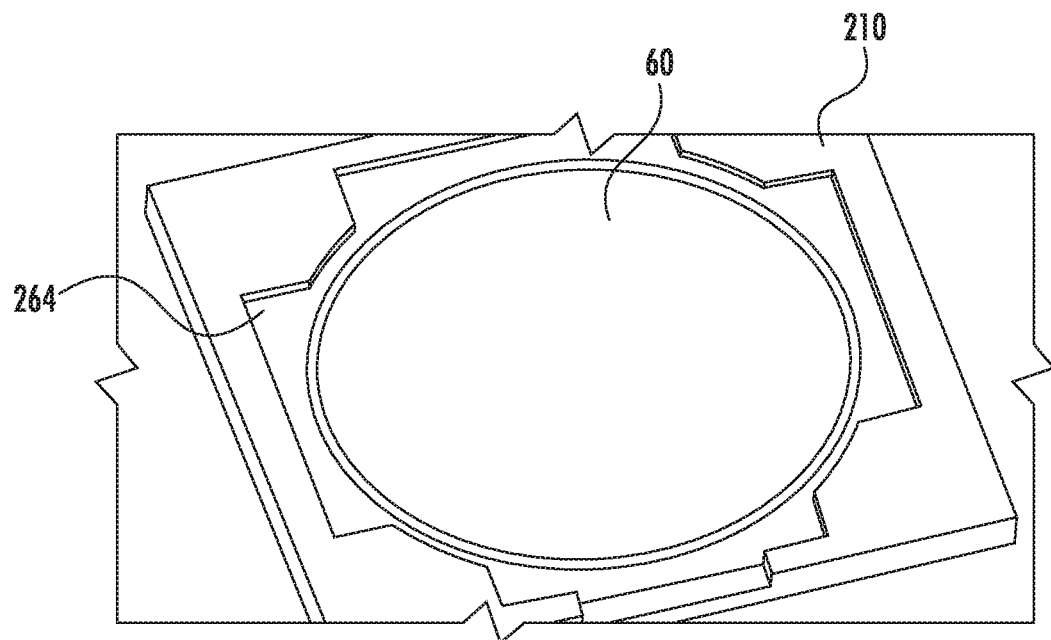
FIG. 6 depicts example edge reflectors used in a wafer plane plate of a millisecond anneal system according to example embodiments of the present disclosure.

For instance, edge reflectors can be used to redirect light from the bottom lamps 240 to an edge of the semiconductor substrate 60. As an example, FIG. 6 depicts example edge reflectors 264 that form a part of the wafer plane plate 210 that can be used to direct light from the bottom lamps 240 to the edge of the semiconductor substrate 60. The edge reflectors 264 can be mounted to the wafer plane plate 210 and can surround or at least partially surround the semiconductor substrate 60.

Figure 7:
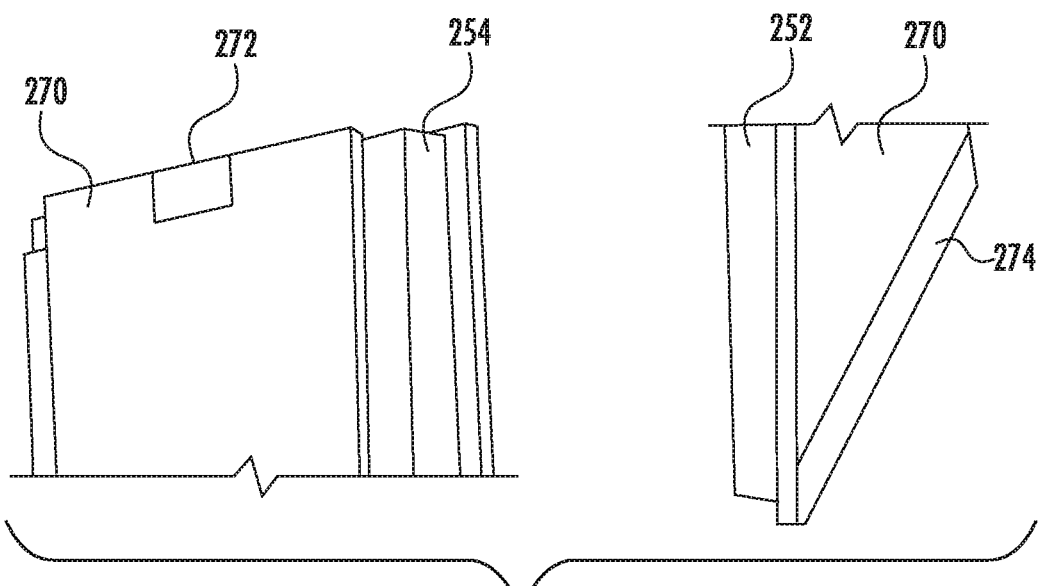
FIG. 7 depicts example reflectors that can be used in a millisecond anneal system according to example embodiments of the present disclosure.

In some embodiments, additional reflectors can also be mounted on chamber walls near the wafer plane plate 210. For example, FIG. 7 depicts example reflectors that can be mounted to the process chamber walls that can act as reflector mirrors for the heating light. More particularly, FIG. 7 shows an example wedge reflector 272 mounted to lower chamber wall 254. FIG. 7 also illustrates a reflective element 274 mounted to reflector 270 of an upper chamber wall 252. Uniformity of processing of the semiconductor substrate 60 can be tuned by changing the reflection grade of the wedge reflectors 272 and/or other reflective elements (e.g., reflective element 274) in the processing chamber 200.

Figure 8:
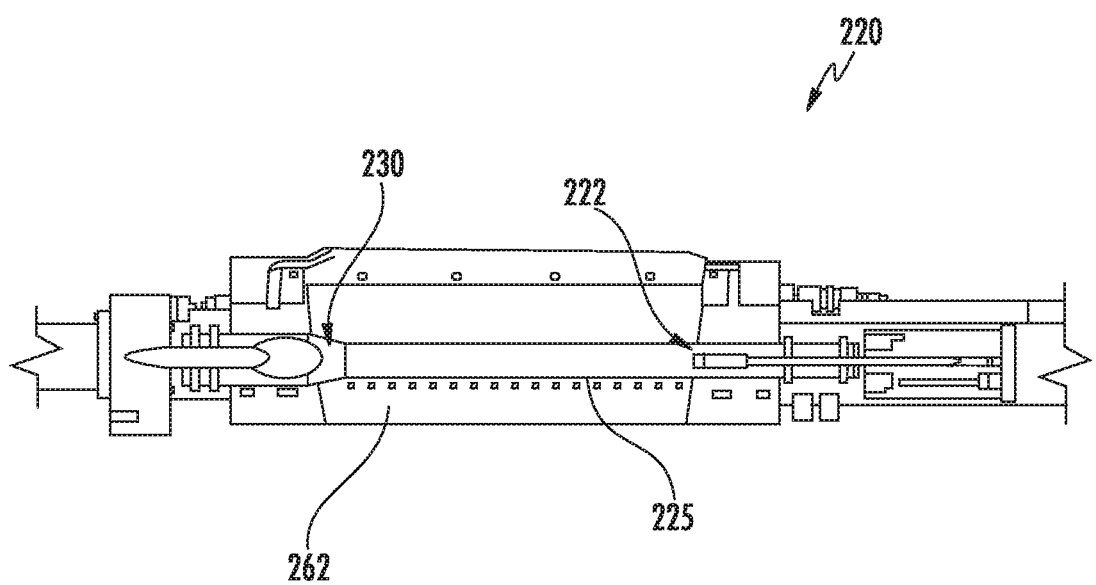
FIG. 8 depicts an example arc lamp that can be used in a millisecond anneal system according to example embodiments of the present disclosure.
Figure 9:
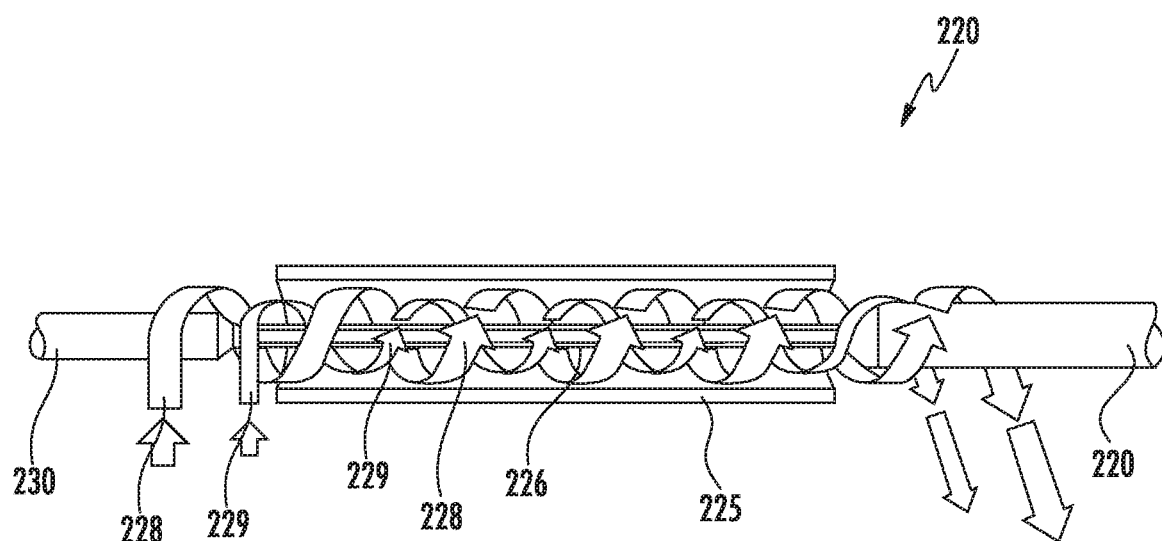
FIGS. 9-10 depict the operation of an example arc lamp according to example embodiments of the present disclosure.

FIGS. 8-11 depict aspects of example upper arc lamps 220 that can be used as light sources for intense millisecond long exposure of the top surface of the semiconductor substrate 60 (e.g., the "flash"). For instance, FIG. 8 depicts a cross-sectional view of an example arc lamp 220. The arc lamp 220 can be, for instance, an open flow arc lamp, where pressurized Argon gas (or other suitable gas) is converted into a high pressure plasma during an arc discharge. The arc discharge takes place in a quartz tube 225 between a negatively charged cathode 222 and a spaced apart positively charged anode 230 (e.g., spaced about 300 mm apart). As soon as the voltage between the cathode 222 and the anode 230 reaches a breakdown voltage of Argon (e.g., about 30 kV) or other suitable gas, a stable, low inductive plasma is formed which emits light in the visible and UV range of the electromagnetic spectrum. As shown in FIG. 9, the lamp can include a lamp reflector 262 that can be used to reflect light provided by the lamp for processing of the semiconductor substrate 60.

Figure 10:
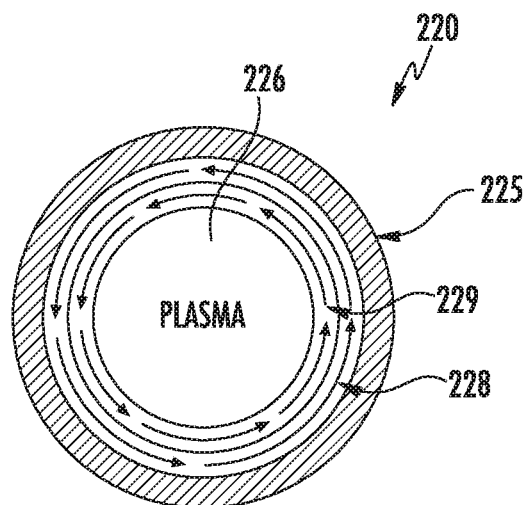
Figure 11:
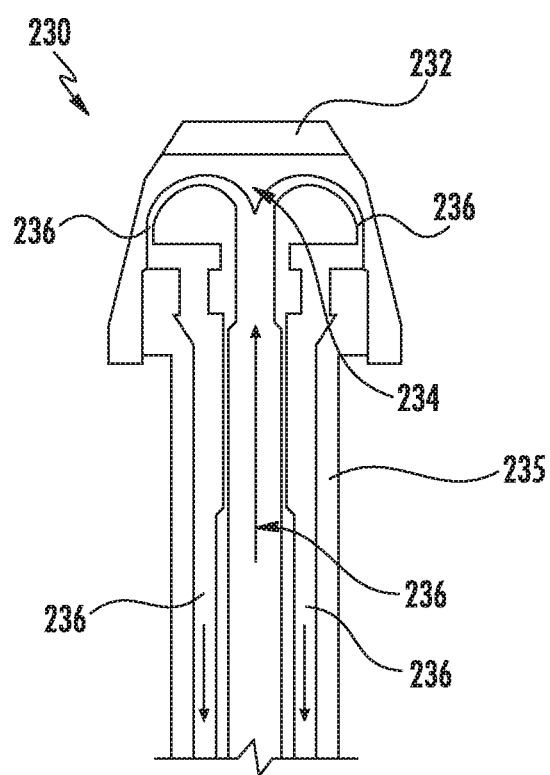
FIG. 11 depicts a cross-sectional view of an example electrode according to example embodiments of the present disclosure.

FIGS. 10 and 11 depict aspects of example operation of an arc lamp 220 in millisecond anneal system 80 according to example embodiments of the present disclosure. More particularly, a plasma 226 is contained within a quartz tube 225 which is water cooled from the inside by a water wall 228. The water wall 228 is injected at high flow rates on the cathode end of the lamp 200 and exhausted at the anode end. The same is true for the Argon gas 229, which is also entering the lamp 220 at the cathode end and exhausted from the anode end. The water forming the water wall 228 is injected perpendicular to the lamp axis such that the centrifugal action generates a water vortex. Hence, along the center line of the lamp a channel is formed for the Argon gas 229. The Argon gas column 229 is rotating in the same direction as the water wall 228. Once a plasma 226 has formed, the water wall 228 is protecting the quartz tube 225 and confining the plasma 226 to the center axis. Only the water wall 228 and the electrodes (cathode 230 and anode 222) are in direct contact with the high energy plasma 226.

FIG. 11 depicts a cross sectional view of an example electrode (e.g., cathode 230) used in conjunction with an arc lamp according to example embodiments of the present disclosure. FIG. 11 depicts a cathode 230. However, a similar construction can be used for the anode 222.

In some embodiments, as the electrodes experience a high heat load, one or more of the electrodes can each include a tip 232. The tip can be made from tungsten. The tip can be coupled to and/or fused to a water cooled copper heat sink 234. The copper heat sink 234 can include at least a portion the internal cooling system of the electrodes (e.g., one or more water cooling channels 236. The electrodes can further include a brass base 235 with water cooling channels 236 to provide for the circulation of water or other fluid and the cooling of the electrodes.

The arc lamps used in example millisecond anneal systems according to aspects of the present disclosure can be an open flow system for water and Argon gas. However, for conservation reasons, both media can be circulated in a close loop system in some embodiments.

Figure 12:
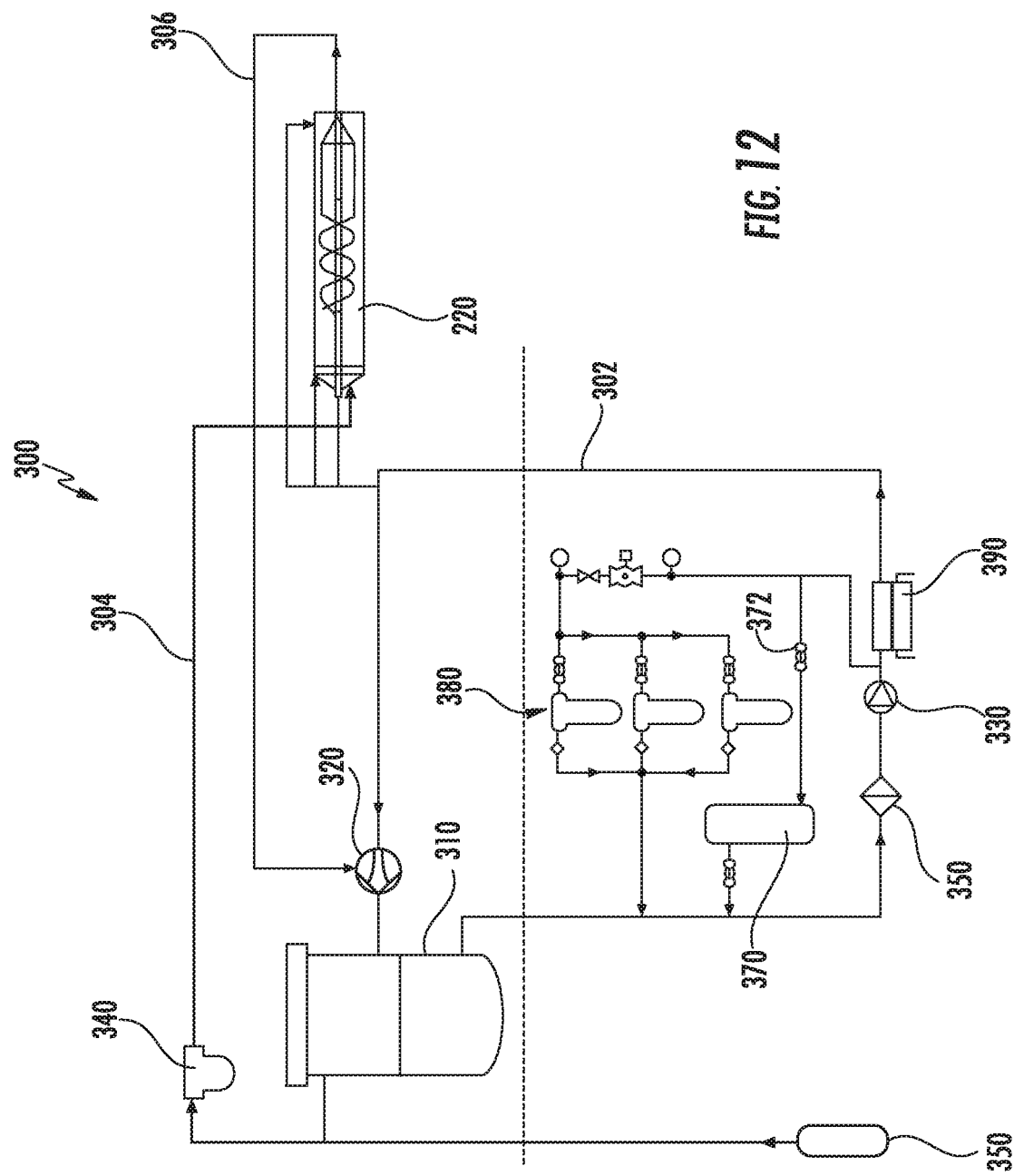
FIG. 12 depicts an example closed loop system for supplying water and gas (e.g., Argon gas) to example arc lamps used in a millisecond anneal system according to example embodiments of the present disclosure.

FIG. 12 depicts an example closed loop system 300 for supplying water and Argon gas needed to operate the open flow Argon arc lamps used in millisecond anneal systems according to example embodiments of the present disclosure.

More particularly, high purity water 302 and Argon 304 is fed to the lamp 220. The high purity water 302 is used for the water wall and the cooling of the electrodes. Leaving the lamp is a gas/water mixture 306. This water/gas mixture 306 is separated into gas free water 302 and dry Argon 304 by separator 310 before it can be re-fed to the inlets of the lamp 220. To generate the required pressure drop across the lamp 220, the gas/water mixture 306 is pumped by means of a water driven jet pump 320.

A high power electric pump 330 supplies the water pressure to drive the water wall in the lamp 220, the cooling water for the lamp electrodes, and the motive flow for the jet pump 320. The separator 310 downstream to the jet pump 320 can be used extracting the liquid and the gaseous phase from the mixture (Argon). Argon is further dried in a coalescing filter 340 before it re-enters the lam 220. Additional Argon can be supplied from Argon source 350 if needed.

The water is passing through one or more particle filters 350 to remove particles sputtered into the water by the arc. Ionic contaminations are removed by ion exchange resins. A portion of water is run through mixed bed ion exchange filters 370. The inlet valve 372 to the ion exchange bypass 370 can be controlled by the water resistivity. If the water resistivity drops below a lower value the valve 372 is opened, when it reaches an upper value the valve 372 is closed. The system can contain an activated carbon filter bypass loop 380 where a portion of the water can be additionally filtered to remove organic contaminations. To maintain the water temperature, the water can pass through a heat exchanger 390.

Figure 13:
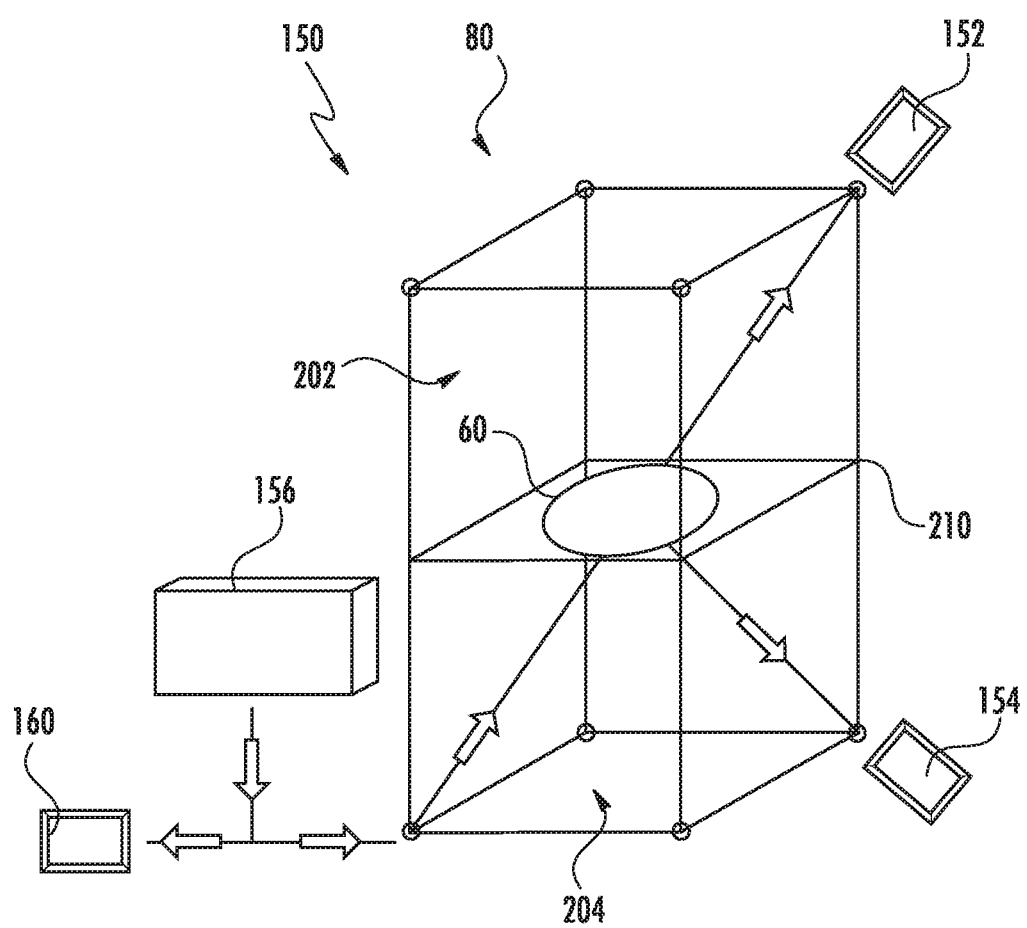
FIG. 13 depicts an example temperature measurement system for a millisecond anneal system according to example embodiments of the present disclosure.

Millisecond anneal systems according to example embodiments of the present disclosure can include the ability to independently measure temperature of both surfaces (e.g., the top and bottom surfaces) of the semiconductor substrate. FIG. 13 depicts an example temperature measurement system 150 for millisecond anneal system 200.

A simplified representation of the millisecond anneal system 200 is shown in FIG. 13. The temperature of both sides of a semiconductor substrate 60 can be measured independently by temperature sensors, such as temperature sensor 152 and temperature sensor 154. Temperature sensor 152 can measure a temperature of a top surface of the semiconductor substrate 60. Temperature sensor 154 can measure a bottom surface of the semiconductor substrate 60. In some embodiments, narrow band pyrometric sensors with a measurement wavelength of about 1400 nm can be used as temperature sensors 152 and/or 154 to measure the temperature of, for instance, a center region of the semiconductor substrate 60. In some embodiments, the temperature sensors 152 and 154 can be ultra-fast radiometers (UFR) that have a sampling rate that is high enough to resolve the millisecond temperature spike cause by the flash heating.

The readings of the temperature sensors 152 and 154 can be emissivity compensated. As shown in FIG. 13, the emissivity compensation scheme can include a diagnostic flash 156, a reference temperature sensor 158, and the temperature sensors 152 and 154 configured to measure the top and bottom surface of the semiconductor wafers. Diagnostic heating and measurements can be used with the diagnostic flash 156 (e.g., a test flash). Measurements from reference temperature sensor 158 can be used for emissivity compensation of temperature sensors 152 and 154.

In some embodiments, the millisecond anneal system 200 can include water windows. The water windows can provide an optical filter that suppresses lamp radiation in the measurement band of the temperature sensors 152 and 154 so that the temperature sensors 152 and 154 only measure radiation from the semiconductor substrate.

The readings of the temperature sensors 152 and 154 can be provided to a processor circuit 160. The processor circuit 160 can be located within a housing of the millisecond anneal system 200, although alternatively, the processor circuit 160 may be located remotely from the millisecond anneal system 200. The various functions described herein may be performed by a single processor circuit if desired, or by other combinations of local and/or remote processor circuits.

Example Determination of Wafer Stress in a Millisecond Anneal System

Example aspects of the present disclosure are directed to a method for estimating the deformation and/or stress distribution of a semiconductor substrate (e.g., a wafer) during a millisecond anneal process using wafer surface normal measurements. The method can be implemented by, for instance, one or more processor circuits based on wafer surface normal measurements and/or surface temperature measurements. The method can generate a model of specifying the shape and motion of the semiconductor substrate over time and can estimate local contact stress at points of contact with support pins using the model. In some embodiments, temperature measurements can be used in conjunction with the model to estimate a stress distribution across the semiconductor substrate.

Figure 14:
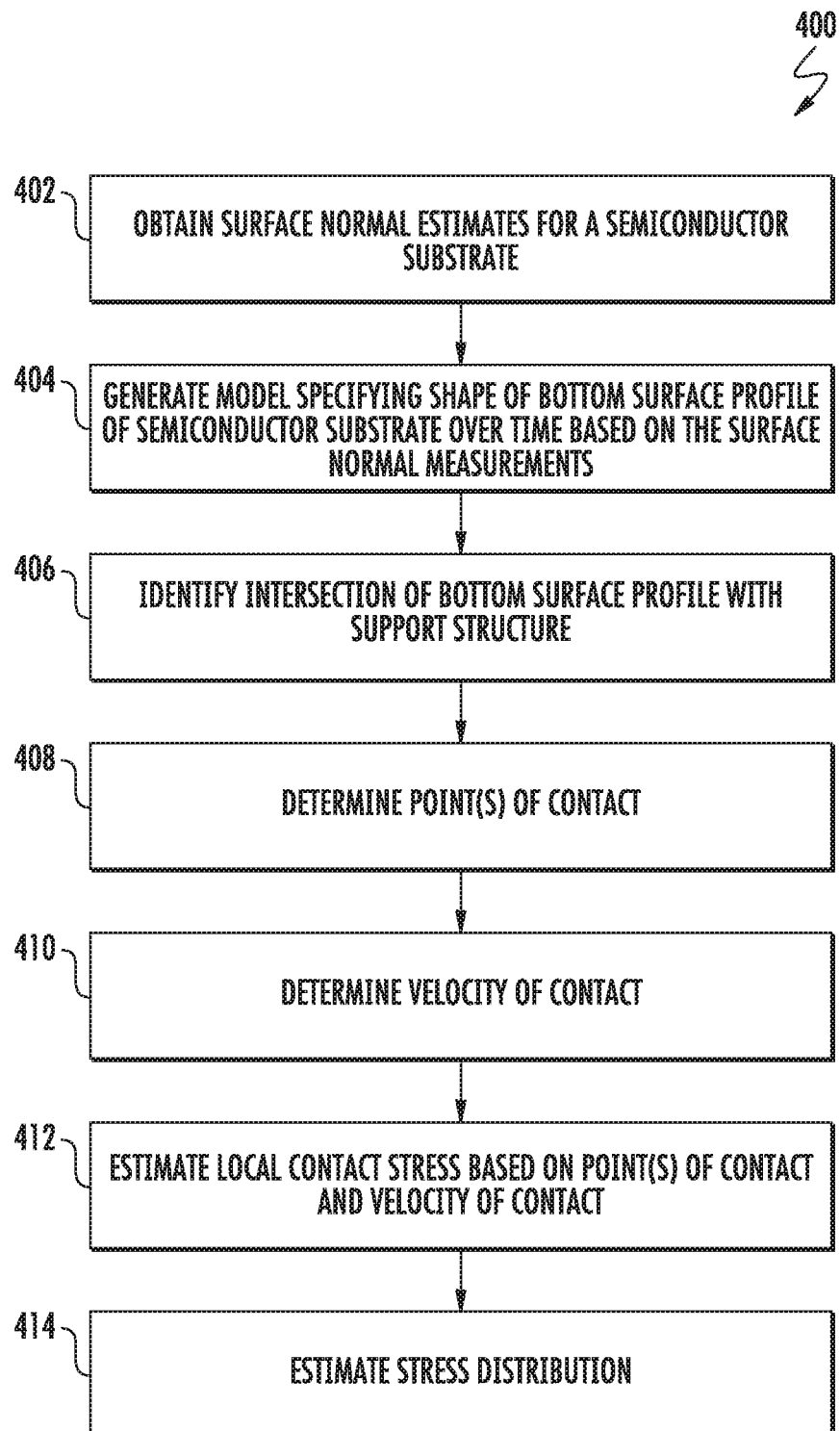
FIG. 14 depicts a flow diagram of an example method according to example embodiments of the present disclosure.

FIG. 14 depicts an example method (300) of estimating local contact stresses at points of contact of a semiconductor substrate during a millisecond anneal process according to example embodiments of the present disclosure. FIG. 14 can be implemented by one or more processor circuits. The processor circuit(s) can be configured to execute computer-readable instructions programmed in one or more memory devices to execute the methods described herein. The processor circuit(s) can be a part of the millisecond anneal system (e.g., as part of one or more controllers) or can be located remote from the millisecond anneal system.

At (402), the method can include obtaining, by the processor circuit(s), surface normal estimates for the semiconductor substrate. The surface normal estimates can be accessed, for instance, from a memory device. The surface normal measurements can be acquired at different time instants over a time period. In some embodiments, wafer surface normal estimates can be obtained using, for instance, image analysis as described in U.S. Pat. No. 9,070,590, which is incorporated herein by reference. More particularly, in one example, a known scene (e.g., a pattern of grid lines) can be projected onto, for instance, the backside of a wafer from an illumination source. A known scene point (e.g., an intersection of grid lines or other known scene points) can be reflected from the surface of the substrate and imaged by the camera. The images can be processed to determine, for instance, the location of a reflection point, a direction of a surface normal, and/or a reflection angle. Wafer surface normal measurements over the time period can be obtained in other suitable manners without deviating from the scope of the present disclosure.

At (404), the method can include generating model specifying shape and motion of a bottom surface profile of the semiconductor substrate over time based at least in part on the obtained surface normals. For instance, in some embodiments, the bottom surface profile of the wafer can be estimated using a set of M surface normals that are obtained over the bottom surface of the wafer. The positions of the surface normals do not have to be uniformly spaced but can be distributed over the region of interest, (e.g., the entire bottom surface of the wafer). Each set of M surface normals can be associated with the shape of the bottom surface of the wafer at the nth time instant, $t_n$. The mth estimated surface normal, or more precisely the unit surface normal, is denoted as $\hat{n}_e(x_m, z_m)$, where $(x_m, z_m)$ is the position of the normal at the bottom of the wafer. Note that vectors are denoted with bold-face type and are defined as column vectors. The coordinate system used to identify the position of the surface normals can be such that a perfectly flat wafer will lie in the xz-plane with the bottom at y=0 and the radial center at x=z=0, with the positive y-axis directed to the top, (device-side), of the wafer, and the positive x-axis and z-axis conveniently aligned with the lateral dimensions of the tool.

Given a set, $M=\{\hat{n}_e(x_m, z_m): m=1, 2, \ldots, M\}$, of wafer surface normals, the problem of estimating a surface profile from M can be an ill-posed problem. More particularly, there can be an infinite number surface profiles that can generate the set M. To have a tractable solution can require constraining the possible surface profiles to a class of functions that can: (1) Provide a single optimal solution or at least a locally acceptable solution; and (2) approximate the true surface profile to an acceptable level of error.

To meet these two requirements, a class of two dimensional, nth order polynomials can be used, that is $$P_n(x,z) = \sum_{k=0}^{n} \alpha_{ij} x^i z^j, \quad 0 \leq i+j \leq k \tag{1.1}$$

where the total number of coefficients is given by (n+1)(n+2)/2 and the polynomial surface is expressed as a function x and z corresponding to the previously defined coordinate system, such that a flat wafer will lie in the xz-plane with the bottom at y=0. In some embodiments, it can be assumed that a n=4 order polynomial can provide an acceptable approximation of the true bottom surface profile of the wafer during the flash process.

The problem of fitting this polynomial surface to the set Mean require comparing the surface normal of the polynomial surface, $\hat{n}_p(x_m, z_m)$, to the estimated surface normal, $\hat{n}_p(x_m, z_m)$, obtained from the image analysis, and then adjusting the polynomial coefficients, $\alpha_{ij}$, so as have $\hat{n}_p(x_m, z_m)$ as close as possible to $\hat{n}_e(x_m, z_m)$ for every normal in the set M. This problem is a non-linear optimization problem and can require setting up an objective, or cost, function that must be minimized, (or maximized), such that once a minimum is found, $\hat{n}_p(x_m, z_m)$ is as close as possible to $\hat{n}_e(x_m, z_m)$ for all m.

One example cost function can be defined as:

$$C = \sum_{m=1}^{M} w_m \| \hat{n}_e * x_m, z_m) - \hat{n}_p(x_m, z_m) \|^2, \quad 0 \leq w_m \leq 1 \tag{1.2}$$

where $\|\cdot\|$ is the $l_2$-norm operator, and $w_m$ is a weighting factor. The cost function is therefore a measure of the weighted sum squares of the distances between two vectors. The weighting factor allows the emphasis or de-emphasis of surface normals and can be set according to the uncertainty estimates associated with $\hat{n}_e(x_m, z_m)$, that is, high uncertainty causes $w_m \to 0$. The problem statement is then $$C^+ = \min_{\alpha_{ij} \in \Re}(C) \tag{1.3}$$

where $C^+$ represent the local, or possibly a global, minimum of C, and the minimization is with respect to the polynomial coefficients which are limited to the real numbers, R. This minimization can be achieved using any number of non-linear minimization procedures.

To evaluate the cost function so it can be minimized, an explicit expression for $\hat{n}_p(x_m, z_m)$ as $\hat{n}_e(x_m, z_m)$ can be provided by the image analysis. This expression for $\hat{n}_p(x_m, z_m)$ can be obtained by first differentiating $P_n(x,z)$ with respect to x and z, to obtain, $$\left. \frac{dP_n(x,z)}{dx} \right|_{\substack{x=x_m \\ z=z_m}} = \frac{d}{dx} \sum_{k=0}^{n} \alpha_{ij} x^i z^j, \quad 0 \leq i+j \leq k, \tag{1.4}$$

$$= \sum_{k=1}^{n} i\alpha_{ij} x_m^{(i-1)} z_m^j, \quad 0 < i+j \leq k, \quad i \geq 1,$$

and $$\left. \frac{dP_n(x,z)}{dz} \right|_{\substack{x=x_m \\ z=z_m}} = \frac{d}{dz} \sum_{k=0}^{n} \alpha_{ij} x^i z^j, \quad 0 \leq i+j \leq k, \tag{1.5}$$

$$= \sum_{k=1}^{n} j\alpha_{ij} x_m^i z_m^{(j-1)}, \quad 0 < i+j \leq k, \quad j \geq 1.$$

Equation (1.4) and Equation (1.5) represent directional derivatives and can be viewed as vectors lying in the xy and zy-planes, respectively, that can also be expressed as unit column vectors $\hat{n}_x(x,z)$, $\hat{n}_z(x, z)$, using, $$\hat{n}_x(x,z) = \frac{\left[1, \frac{dP_n(x,z)}{dz}, 0\right]^T}{\left\| \left[1, \frac{dP_n(x,z)}{dz}, 0\right] \right\|},$$

and $$\hat{n}_z(x,z) = \frac{\left[0, \frac{dP_n(x,z)}{dx}, 1\right]^T}{\left\| \left[0, \frac{dP_n(x,z)}{dx}, 1\right] \right\|},$$

where T is the transpose operator. In addition, these two vectors, which are perpendicular to each other, must also lie in a plane that is tangent to the point, $(x_m, z_m)$, on the polynomial surface where the differentiation is taken. Given this, the surface normal at this point can be obtained by taking the cross-product of these unit vectors, $$\hat{n}_p(x_m, z_m) = \hat{n}_x(x_m, z_m) \otimes \hat{n}_z(x_m, z_m) \tag{1.9}$$

where $\otimes$ is the cross-product operator, and the direction of $\hat{n}_p(x_m, z_m)$ is such that it is pointing away from the bottom of the surface, that is, if the tangent plane lies in the xz-plane, $\hat{n}_p(x_m, z_m)$ will point in the −y-axis direction. Note that since $\hat{n}_p(x_m, z_m)$ is obtained by differentiating Equation (1.1), the k =0 coefficient vanishes and is not used to approximate the surface of the wafer. In other words, only the shape of the surface is obtained and the vertical offset, or position of the surface along the y-axis, is not determined. More precisely, the shape of the surface is approximated with the polynomial given by $$P_n(x, z) = \sum_{k=0}^{n} \alpha_{ij} x^i z^j, \quad 0 \leq i+j \leq k, \quad \alpha_{00} = 0, \tag{1.10}$$

$$= \sum_{k=1}^{n} \alpha_{ij} x^i z^j, \quad 0 < i+j \leq k$$

It should be noted that the approximation of the wafer surface at points not between any two or more measured surface normals, is an extrapolation whose error can increase as the point of approximation moves away from the measured surface normals.

In some cases, there can exist a minimum number of surface normals that are needed to obtain a suitable surface approximation using a two-dimensional nth order polynomial. In some implementations, this minimum number is precisely given by the total number of coefficients, (n+1)(n+2)/2−2. For example, assume that only a n=1 order two-dimensional polynomial, that is a plane, is used. It is clear that to uniquely define any plane in three-dimensional space requires at least three points, that is, for n=1, (n+1)(n+2)/2=(2)(3)/2=3, but only one surface normal is needed to specify the orientation of the plane, of course the plane is not uniquely defined as the position of the plane along the normal is not specified. Therefore, setting n=4, requires at least (5)(6)/2−2=13 surface normals to define the surface but the position of the surface is not known. If more than 13 surface normal vectors are available, the minimization process will find the best, in the least squares sense, surface approximation that provides the closest fit to the estimated surface normals, $\hat{n}_e(x_m, z_m)$.

According to example aspects of the present disclosure, a systematic error typically present in the wafer surface normal measurements can be subtracted out by obtaining a set of wafer surface normal measurements when the wafer is assumed to be flat, which occurs just prior to the start of the millisecond temperature anneal process. This systematic error can be eliminated by subtracting the surface approximation obtained from wafer surface normal measurements of the flat wafer from subsequent surface approximations. In particular, the corrected polynomial surface approximation at t=$t_n$ can be given by $$Q_n(x,z,t_n)=P_n(x,z,t_n)-P_n(x,z,t_0) \quad (1.11)$$

where $Q_n$(x, z, $t_n$) is the corrected polynomial surface approximate at time instance tn, and t0 identifies the time instance associated with the flat wafer.

As noted previously, the surface approximation of the bottom surface of the wafer at $t_n$ only provides the shape of the surface and not the vertical offset position along the y-axis. This vertical offset can be obtained from measurements, for example, obtained using laser reflectometry, that provide the vertical position of the center of the wafer at time tn.

Alternatively, if the vertical position of the center of the wafer is not physically measured, it can be estimated using the known physical wafer support dimensional constraints. For instance, the wafer, just prior to the millisecond temperature anneal process, can be lying flat on the support structure (e.g., support pins) and that the center of mass of the wafer can be experiencing a downward force from gravity. As an illustrative example of how this estimate of the vertical position of the wafer can be made, consider that at $t_0$, the wafer is lying flat on the support structure, that is the center bottom of the wafer is at y=0. At time instance $t_1$ the wafer surface will have assumed some shape that is approximated with $Q_4$ (x, z, $t_1$), with an unknown value for $\alpha_{00}$. Over the time interval $\Delta t_1=t_1-t_0$, the wafer will experience the downward force of gravity, g, that will, if the wafer is not constrained by the support structure, pull the position of the center of mass of the wafer downward by an amount given by $$d=0.5g\Delta t_1^2 \quad (1.12)$$

At (406), the method can include identifying an intersection of a bottom surface profile specified by the model with support structures at different time intervals. More particularly, if gravity were not present and the wafer was suspended in free space, the center of mass of the wafer would not change position since no external force is acting on the wafer. Therefore, by Newton's laws of motion, the time varying shape the wafer, due to the millisecond thermal annealing process, can be such that it does not change the position of the center of mass. This fact can be used to advantageously in at least two ways.

Firstly, it becomes apparent that by locating support structure elements, for example the support pins, at positions that have the initial change in wafer shape moving away from the support pins, that wafer contact can be avoided with the support pins, at least over some initial interval of time. This avoidance of contact with the support pins can be possible because the typical distance the wafer moves in a given time interval is greater than the distance the wafer would be pulled down by gravity. Of course, for longer time intervals the wafer will be pulled down by gravity far enough that contact with the support pins, or other support elements, will occur.

Secondly, during the interval of time the wafer has no contact with any support elements, and is only be pulled downward by gravity, the wafer shape estimates, given by model $Q_1$(x, z, $t_n$), can indicate that the vertical position of the center of mass of the wafer, given by the volume, V, integral $$y_{com} = \frac{1}{M_w} \int \int \int_V Q_1(x, z, t_n)\rho(x, y, z)dxdydz, \quad (1.13)$$

where $M_w$ is the total mass of the wafer and $\rho$ is the density of wafer, and $y_{com}$ is near zero to within a given error tolerance, $Err_{y_{com}}$. In other words, if $|y_{com}| \leq Err_{y_{com}}$, the wafer is still falling and has not contacted any support elements.

When the wafer contacts a support structure element the wafer will experience a reaction force caused by the wafer pushing against one or more support structure points. Again, by Newton's laws of motion, the position of the center of mass of will be changed. During contact it is highly likely that the shape of the wafer will change such that the vertical position of the center of mass of the wafer will no longer be near zero, that is $|y_{com}| > Err_{y_{com}}$. In this case, the vertical position of the wafer, given by the value of $\alpha_{00}$ can estimated by mathematically determining what value of $\alpha_{00}$ is needed to have one, or more, points of the surface of the wafer, which follows the shape given by $Q_1$(x, z, $t_n$), within $Err_{y_{com}}$ of intersecting any support structure elements. This process of determining if the wafer surface intersects any support structure elements can be used for every time instance, tn. The intersection of any the shape given by model $Q_1$(x, z, $t_n$) with the support structures can be used to determine if and when the wafer surface contacts the support structure.

Accordingly, the method (400) can use the intersection of the model to determine the point(s) of contact (408) as well as the velocity of contact (410). Once the point(s) of contact and velocity of contact are known, this information can be used to calculate the magnitude of local contact stress (e.g., as a function of velocity) at the point(s) of contact as shown at (412) (e.g., using laws of motion).

In addition to the local contact stress, some embodiments of the present disclosure are directed to optionally estimating the stress distribution in the wafer using $Q_1$(x, z, $t_n$) and temperature measurements from the top and bottom of the wafer (414). For instance, temperature estimates of the semiconductor substrate can be obtained. The stress distribution can be dependent on the temperature at points on the substrate. A finite element analysis can be implemented that solves for the stress distribution required to satisfy the boundary and initial conditions provided by $Q_4$ (X, z, $t_n$) and the temperature measurements. In some embodiments, wafer surface temperature estimates can be obtained based on radiation thermally emitted from a center portion of the wafer surface of the top and bottom of the semiconductor wafer. The wafer surface temperature measurements can be obtained in other suitable manners without deviating from the scope of the present disclosure.

From the model specifying shape and motion of the substrate, the estimated local contact stress and/or the estimated stress distribution can be used for a variety of purposes. In some embodiments, thermal processing in the millisecond anneal system can be modified based on the model, the estimated local contact stress, and/or the estimated stress distribution. For instance, support structures can be designed and/or located based on model, the estimated local contact stress, and/or the estimated stress distribution. Heating recipes (e.g., process recipes) can be specified or modified using the information to reduce local contact stress. Other suitable parameters and factors can be modified based on the model, estimated local contact stress, and/or stress distribution without deviating from the scope of the present disclosure.

In some embodiments, the local contact stress and/or stress distribution can be determined in real time and/or near real time during processing of the substrate. Thermal processing (e.g., process recipes, controlling profile of lamp heating, etc.) can be modified during processing to reduce the local contract stress based at least in part on the calculations of local contact stress according to example embodiments of the present disclosure.

Example Wafer Support Pins for Reducing Contact Stress in a Millisecond Anneal System According to example aspects of the present disclosure, the contact stress a substrate experiences when the surface of the substrate contacts the support pin, for instance, with a relative velocity, can be reduced. More particularly, in some embodiments, the contact stress can be reduced by increasing the radius of curvature of the support pin such that the extent of the curvature accommodates the varying angle of wafer surface normal at the point of contact, and/or by increasing the smoothness of the surface of the support pin over the region that comes into contact with the wafer surface, for example, by flame polishing quartz support pins.

Figure 15:
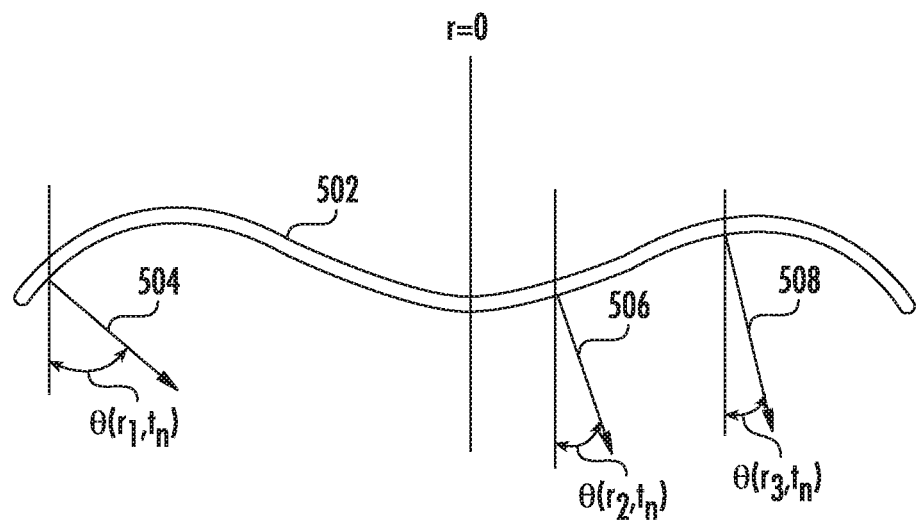
FIG. 15 depicts the varying direction of the surface normal of the wafer during a millisecond anneal process according to example embodiments of the present disclosure.

As shown in FIG. 15, the direction of the surface normal of the wafer, at any particular radial position, can vary during the annealing process. For instance, as illustrated in FIG. 15, a wafer 502 can have a first surface normal 504 at radial position $r_1$ and time instance $t_n$. The wafer 502 can have a second surface normal 506 at radial position $r_2$ and time instance $t_n$. The wafer 508 can have a third surface normal 508 at radial position $r_3$ and time instance $t_n$. This variation in the direction of the surface normal (e.g., surface normal 504, 506, and 508) can be due to the transverse bending of the wafer 502 caused by the time varying transverse thermal gradient and the induced vibrational motion of the wafer 502 during millisecond annealing.

Figure 16:
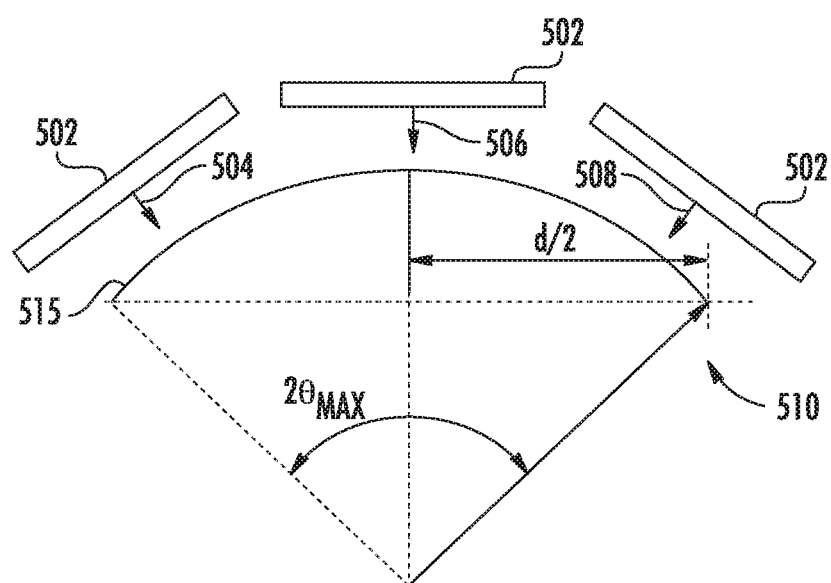
FIG. 16 depicts the varying angles at which a wafer contacts a support pin during a millisecond anneal process according to example embodiments of the present disclosure.

If the surface of the wafer contacts, for example, a support pin, the angle at which the wafer surface is located at the point of contact will be determined by the direction of the wafer surface normal. For, instance, FIG. 16 illustrates the different angles at which a wafer 502 will contact a support pin 510 depending on the direction of the surface normal (e.g., surface normal 504, 506, and 508). To reduce the stress resulting from this contact it can be desirable that the surface of the support structure, for example, the support pin, have the direction of its surface normal as parallel as possible to the direction of the wafer surface normal over the region of contact.

Figures 17A, 17B:
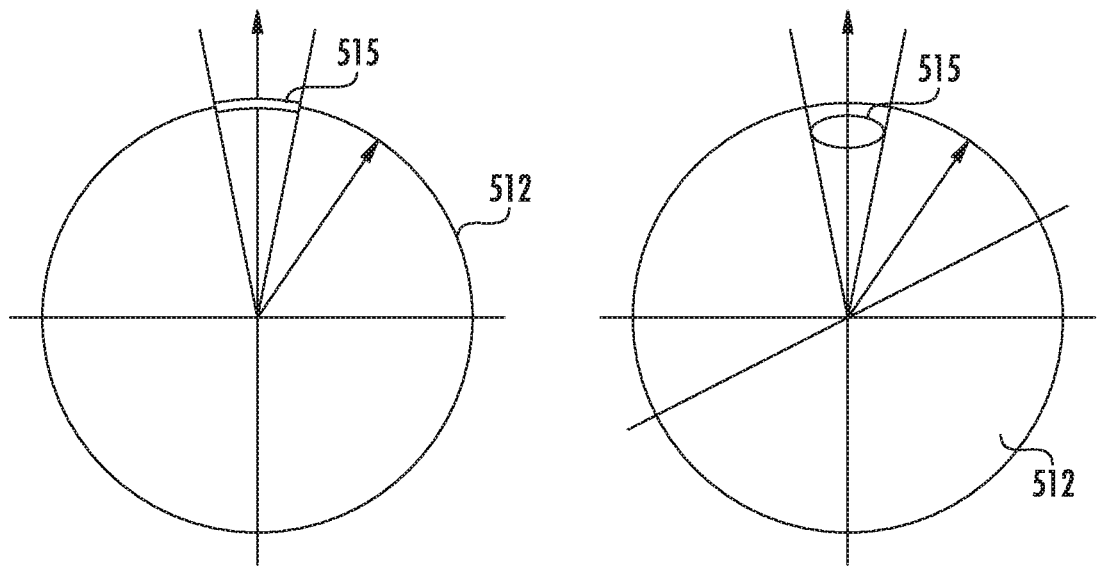
FIGS. 17A and 17B depict an example spherical surface profile of an example support pin according to example embodiments of the present disclosure.

In some embodiments, this can be achieved by configuring the surface of the support structure to present a spherical surface profile to wafer surface. FIG. 17 depicts a representation of a spherical surface profile. More particularly, FIG. 17(a) depicts a cross-sectional view of a sphere 512 as well as a spherical surface profile 515 for a support pin. Similarly, FIG. 17(b) depicts a three-dimensional view of the sphere 512 as well as the spherical surface profile 515 for a support pin.

In some embodiments, the extent or span over which a support pin presents a spherical surface profile can be determined by the maximum angle $\theta_{max}$ of a surface normal with respect to the vertical axis that can be achieved. As an example, the spherical surface profile 510 can have a span that is a function of $2*\theta_{max}$.

Figure 18:
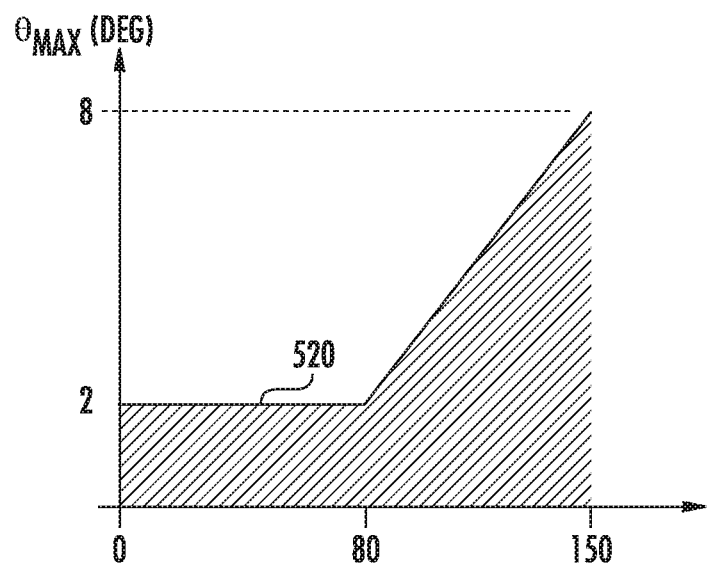
FIG. 18 depicts example bounded values for a maximum angle surface normal as a function of radial position of a point relative to wafer center according to example embodiments of the present disclosure.
Figure 19A:
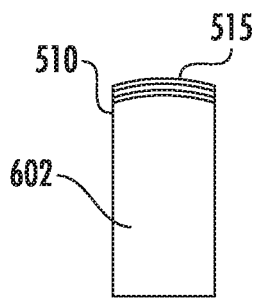
FIGS. 19A-19F depict a variety of different base structures for supporting a spherical surface that can be used in a millisecond anneal system according to example embodiments of the present disclosure.
Figure 19B:
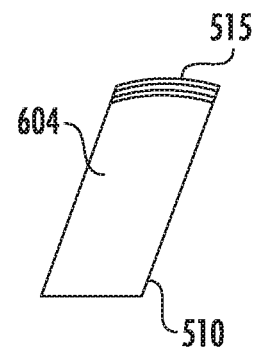
Figure 19C:
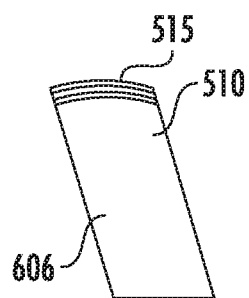
Figure 19D:
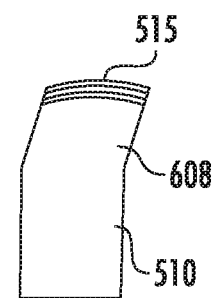
Figure 19E:
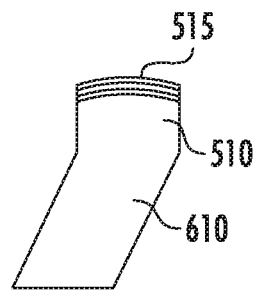
Figure 19F:
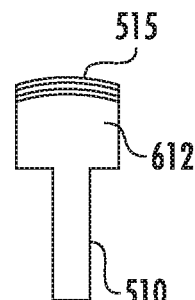

FIG. 18 shows bounded values for a maximum angle $\theta_{max}$ of the wafer surface normal as a function of radial position along the wafer. FIG. 18 plots radial position along the horizontal axis and $\theta_{max}$ along the vertical axis. As illustrated by curve 520, the maximum angle $\theta_{max}$ can be between about 2° to about 8° depending on the radial location of the wafer. By configuring the extent or span of the spherical surface such that it has a span determined based on a $\theta_{max}$ that is at least equal to, or greater, than the bound value of $\theta_{max}$ for the radial location of the wafer can increase the likelihood that a spherical surface is presented to the wafer surface during a potential contact with the support pin.

As an example, the system can include a first support pin at a first radial location and a second support pin at a second radial location. The second radial location can be greater from a center of the semiconductor substrate relative to the first radial location. The first support pin can have a spherical surface profile with a first span. The second support pin can have a spherical surface with a second span. The first span can be less than the second span. For instance, the first span can be based on a maximum angle $\theta_{max}$ of about 2°. The second span can be based on a maximum angle $\theta_{max}$ of about 8°.

In some embodiments, the spherical surface profile of the support pin can have radius of surface curvature, ROC, as large as possible. This curvature can be determined by the cross-sectional width, or diameter for circular cross-sections, d, of the support pin and the maximum angle, $\theta_{max}$, using, for instance:

$$ROC = \frac{d/2}{\sin\theta_{max}}$$

FIG. 16 depicts example d/2 and $\theta_{max}$ for a spherical surface 515 of a support pin 510 according to example embodiments of the present disclosure.

It should be noted that the spherical surface profile of the support structure, for example, the support pin, can be placed on any appropriate base structure, so long as the required spherical surface profile is maintained. FIG. 18 depicts a variety of base structures for supporting a spherical surface that can be used in a millisecond anneal system according to example embodiments of the present disclosure.

For example, FIG. 18(a) depicts a support pin 510 with a spherical surface 515 and a vertical base structure 602. FIG. 18(b) depicts a support pin 510 with a spherical surface 515 and an angled base structure 604 angled towards a first direction. FIG. 18(c) depicts a support pin 510 with a spherical surface 515 and an angled base structure 604 angled toward a second direction. FIG. 18(d) depicts a support pin 510 with a spherical surface 515 and an angled base structure 608. The angled base structure 608 has a first portion angled in a first direction and a second portion angled in a second direction. FIG. 18(d) depicts a support pin 510 with a spherical surface 515 and an angled base structure 610. The angled base structure 608 has a first portion angled in a first direction and a second portion angled in a second direction. FIG. 18(3) depicts a support pin 510 with a spherical surface 515 and a base structure 612 having a T-shaped cross-section.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A millisecond anneal system, comprising:
a processing chamber having a wafer support plate;
a plurality of support pins extending from the wafer support plate configured to support a substrate;
wherein at least one of the support pins has a spherical surface profile to accommodate a varying angle of a substrate surface normal at the point of contact with the substrate;
wherein the spherical surface profile has a span associated with at least two times a maximum angle of the substrate surface normal at a point of contact with the substrate, wherein the spherical surface profile has a radius of curvature determined based on a cross-sectional width of a base structure supporting the spherical profile.

2. The millisecond anneal system of claim 1, wherein the maximum angle is in the range of about 2° to about 8°.

3. The millisecond anneal system of claim 1, wherein the plurality of support pins comprises a first support pin located at a first radial distance relative to a center of a substrate and a second support pin located at a second radial distance relative to a center of the substrate, the second radial distance being greater than the first radial distance.

4. The millisecond anneal system of claim 3, wherein the first support pin has a spherical surface profile with a first span and the second support pin has a spherical surface profile with a second span, the second span being greater than the first span.

5. The millisecond anneal system of claim 1, wherein the spherical surface profile is polished.

6. The millisecond anneal system of claim 1, wherein the support pin comprises a quartz material.

7. The millisecond anneal system of claim 1, wherein the base structure is a vertical base structure.

8. The millisecond anneal system of claim 1, wherein the base structure is an angled base structure.

9. The millisecond anneal system of claim 1, wherein the base structure has a T-shaped cross-section.

10. A wafer support plate configured to support a substrate in a thermal processing system, comprising:
a plurality of support pins;
wherein at least one of the support pins has a spherical surface profile to accommodate a varying angle of a substrate surface normal at the point of contact with the substrate;
wherein the spherical surface profile has a span associated with at least two times a maximum angle of the substrate surface normal at a point of contact with the substrate, wherein the spherical surface profile has a radius of curvature determined based on a cross-sectional width of a base structure supporting the spherical profile.

11. The wafer support plate of claim 10, wherein the maximum angle is in the range of about 2° to about 8°.

12. The wafer support plate of claim 10, wherein the plurality of support pins comprises a first support pin located at a first radial distance relative to a center of the wafer support plate and a second support pin located at a second radial distance relative to a center of the wafer support plate, the second radial distance being greater than the first radial distance.

13. The wafer support plate of claim 12, wherein the first support pin has a spherical surface profile with a first span and the second support pin has a spherical surface profile with a second span, the second span being greater than the first span.

14. The wafer support plate of claim 10, wherein the spherical surface profile is polished.

15. The wafer support plate of claim 10, wherein the support pin comprises a quartz material.

* * * * *